US012398462B2

(12) United States Patent
Cong

(10) Patent No.: US 12,398,462 B2
(45) Date of Patent: Aug. 26, 2025

(54) PROCESS CHAMBER

(71) Applicant: Applied Materials, Inc., Santa Clara, CA (US)

(72) Inventor: Zhepeng Cong, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 3 days.

(21) Appl. No.: 18/305,750

(22) Filed: Apr. 24, 2023

(65) Prior Publication Data
US 2024/0352579 A1 Oct. 24, 2024

(51) Int. Cl.
C23C 16/44 (2006.01)
C23C 16/455 (2006.01)
C23C 16/46 (2006.01)

(52) U.S. Cl.
CPC ........ C23C 16/4405 (2013.01); C23C 16/455 (2013.01); C23C 16/463 (2013.01)

(58) Field of Classification Search
CPC . C23C 16/4405; C23C 16/455; C23C 16/463; C23C 16/54; C23C 16/45551; C23C 16/545; C23C 16/4412; C23C 14/568; C23C 16/4401; H01L 21/6719; H01L 21/67196; H01L 21/67201; H01L 21/67173; H01L 21/67184; H01L 21/6776; H01L 21/67161; H01L 21/67155; H01L 21/67017; H01L 21/67069; H01L 21/67748; H01L 21/67751; H01L 21/67745
USPC ......... 118/719; 156/345.31, 345.32
See application file for complete search history.

(56) References Cited

U.S. PATENT DOCUMENTS

| | | | |
|---|---|---|---|
| 8,216,375 B2 | 7/2012 | Liu | |
| 10,281,261 B2 | 5/2019 | Paul et al. | |
| 10,544,519 B2 | 1/2020 | Savas et al. | |
| 10,861,722 B2 | 12/2020 | Colombeau et al. | |
| 2003/0049372 A1* | 3/2003 | Cook | C23C 16/345 |
| | | | 118/724 |
| 2004/0053515 A1* | 3/2004 | Comita | C30B 33/00 |
| | | | 257/E21.119 |
| 2004/0144323 A1 | 7/2004 | Kai | |
| 2011/0027973 A1* | 2/2011 | Su | C23C 16/481 |
| | | | 257/E21.09 |
| 2012/0263875 A1 | 10/2012 | Brenninger et al. | |
| 2014/0079526 A1* | 3/2014 | Oyama | H01L 21/68 |
| | | | 269/55 |
| 2014/0261159 A1 | 9/2014 | Okabe et al. | |
| 2014/0326185 A1* | 11/2014 | Lau | C23C 16/45563 |
| | | | 118/728 |
| 2017/0148654 A1 | 5/2017 | Paul et al. | |
| 2018/0182652 A1* | 6/2018 | Seshimo | H01L 21/67017 |
| 2021/0351014 A1* | 11/2021 | Noorbakhsh | H01J 37/32513 |

(Continued)

OTHER PUBLICATIONS

Matweb.com. Silicon properties.*
Matweb.com. Silicon carbide properties.*

Primary Examiner — Rudy Zervigon
(74) Attorney, Agent, or Firm — Patterson + Sheridan, LLP

(57) ABSTRACT

A process chamber is provided including a chamber body enclosing an interior volume and a substrate support assembly in the interior volume. The substrate support assembly includes a substrate support having a substrate receiving surface, an upper plate, and a lower plate, the upper plate positioned over the substrate support. The substrate support is positioned over and spaced apart from the lower plate.

19 Claims, 9 Drawing Sheets

(56) References Cited

U.S. PATENT DOCUMENTS

2022/0064790 A1* 3/2022 Wada ................ H01L 21/67766
2022/0325400 A1   10/2022 Cong et al.

* cited by examiner

PROCESS CHAMBER

BACKGROUND

Embodiments of the present disclosure generally relate to improved process chambers, such as improved semiconductor process chambers configured to perform depositions and cleaning procedures.

DESCRIPTION OF THE RELATED ART

Deposition process chambers are cleaned frequently to improve the process results of the depositions performed in the process chambers. For some depositions, the interior of the process chamber is cleaned after each deposition or after a small number of depositions, such as less than ten depositions. After a specified number of depositions is performed in the chamber, the substrate from the last deposition is removed and the process chamber is cleaned. After the cleaning is complete, a new substrate is moved into the chamber for the next deposition. Each cycle of cleaning has an effect on the throughput of the process chamber and the costs of production for the product being formed.

Accordingly, there is a need for improved process chambers and related methods for increasing the throughput of process chambers and reducing the downtime relating to the cleaning of the process chambers.

SUMMARY

In one embodiment, a process chamber is provided including a chamber body enclosing an interior volume; and a substrate support assembly in the interior volume, the substrate support assembly including a substrate support having a substrate receiving surface, an upper plate, and a lower plate, the upper plate positioned over the substrate support, wherein the substrate support is positioned over and spaced apart from the lower plate.

In another embodiment, a process chamber is provided including: a chamber body enclosing an interior volume; a substrate support assembly in the interior volume, the substrate support assembly including a substrate support having a substrate receiving surface, an upper plate, and a lower plate, the upper plate positioned over the substrate support, wherein the substrate support is positioned over and spaced apart from the lower plate; and a first ring positioned above the lower plate of the substrate support assembly, wherein a portion of the upper plate of the substrate support assembly extends over the first ring.

In another embodiment, a method of processing a substrate is provided including introducing one or more cleaning gases to a first portion of an interior volume of a process chamber located above a substrate support assembly disposed in the interior volume of the process chamber, and cooling a substrate on a substrate support of the substrate support assembly during the introducing of the one or more cleaning gases to the first portion of the interior volume, wherein the substrate support is located in a second portion of the interior volume that is below the first portion.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to improved process chambers, such as improved semiconductor process chambers configured to perform depositions and cleaning procedures. The process chambers described in this disclosure include substrate support assemblies that are configured to move to different positions inside the process chamber and substantially seal different regions of the interior volume of the process chamber from each other in these different positions. The substrate support assembly can include an upper plate and a lower plate. The upper plate and/or the lower plate can be positioned against or spaced apart from another component (e.g., a liner) by a small distance in the different positions, so that the different regions of the interior volume can be substantially sealed form each other. Sealing the different regions of the interior volume from each other enables the different regions to be operated under significantly different conditions. For example, a recently processed substrate can be cooled in a first portion of the process chamber while a high-temperature cleaning process can be performed in a different region of the process chamber. The seal between these two different regions can be used to prevent the highly active cleaning gases from interacting with the substrate that is cooling. Furthermore, a processed substrate in the cooling region of the process chamber can be exchanged with a new substrate for the next process (e.g., deposition) while the cleaning procedure is being executed in the cleaning region of the process chamber. Enabling the substrate to cool and be exchanged while a cleaning procedure is performed in a different region of the interior volume can significantly increase throughput for a process chamber.

Figure 1A:
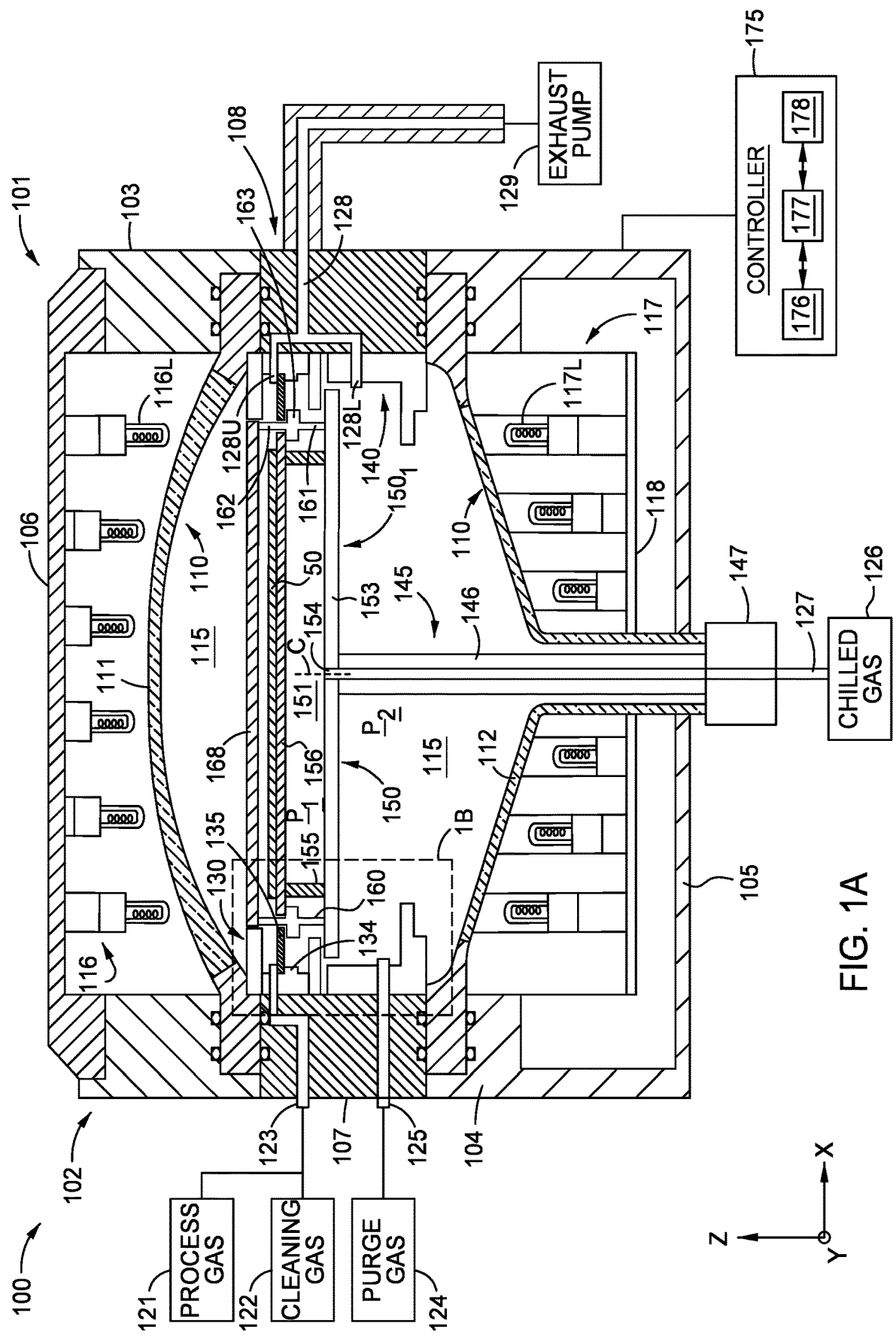
FIG. 1A is a cross-sectional view of a processing system, according to one embodiment.

FIG. 1A is a cross-sectional view of a processing system 100, according to one embodiment. The processing system 100 includes a process chamber 101, a process gas source 121, a cleaning gas source 122, a purge gas source 124, a chilled gas source 126, an exhaust pump 129, and a controller 175. The processing system 100 can be configured to perform epitaxial deposition processes in the process chamber 101. Although the disclosure mainly describes improved processing systems for increasing throughput for epitaxial deposition chambers, the improvements can be applied to other systems for processing substrates in which the substrate is conventionally removed before cleaning the interior of chamber used in the processing system.

The process chamber 101 includes a chamber body 102. The chamber body 102 includes an upper body 103, a lower body 104, a lid 106 positioned on the upper body 103, a gas inlet module 107, and a gas outlet module 108. The lower body 104 can form a bottom 105 of the chamber body 102. The chamber body 102 encloses an internal chamber 110 formed of an infrared transparent material (e.g., quartz). The internal chamber 110 includes an upper chamber 111 and a lower chamber 112 each formed of an infrared transparent material (e.g., quartz). The internal chamber 110 at least partially encloses an interior volume 115 of the process chamber 101.

The process chamber 101 includes an upper lamp module 116 and a lower lamp module 117. The upper lamp module 116 is located between the lid 106 and the upper chamber 111. The lower lamp module 117 is located between the bottom 105 of the lower body 104 and the lower chamber 112. The upper lamp module 116 includes a plurality of lamps 116L configured to direct heat through the upper chamber 111 and into the interior volume 115 during processing. The lower lamp module 117 includes a plurality of lamps 117L configured to direct heat through the lower chamber 112 and into the interior volume 115 during processing. The lower lamp module 117 can include a floor 118. The plurality of lamps 117L can be supported by the floor 118.

The process chamber 101 includes a substrate support apparatus 145. The substrate support apparatus 145 includes a shaft 146, an actuator 147, and a substrate support assembly 150. The shaft 146 couples the actuator 147 to the substrate support assembly 150. The actuator 147 can be configured to raise and lower the substrate support assembly 150 by moving the shaft 146 in a vertical direction. The actuator 147 can also be configured to rotate the shaft 146 and the substrate support assembly 150 about a central vertical axis C extending through a center of the shaft 146.

The substrate support assembly 150 includes a lower plate 153 connected (e.g., fastened) to the shaft 146. The substrate support assembly 150 includes a plurality of inner supports 155 (e.g., three pins) positioned on the lower plate 153. The substrate support assembly 150 includes a susceptor 156 (also referred to as substrate support) positioned on the plurality of inner supports 155. A substrate 50 is positioned on the susceptor 156. The central vertical axis C can also extend through a center of the lower plate 153 and a center of the susceptor 156.

The substrate support assembly 150 includes a support ring 160 positioned on the lower plate 153. The support ring 160 includes a lower portion 161, an upper portion 162, and a central ringed portion 163. The central ringed portion 163 can form a complete ring (i.e., 360 degrees), for example around the central vertical axis C. The upper portion 161 and the lower portion 162 can be shaped like pins, and in some embodiments the portions 161, 162 only extend a few degrees around the central vertical axis C. The pin shape of the portions 161, 162 allows for gas flow around the portions 161, 162, so that process gas can be provided over the substrate 50 and gases can be exhausted from regions over the substrate 50. On the other hand, the ring shape of the central ringed portion 163 and the proximity of the central ring portion 163 to the preheat ring 135 and the susceptor 156 reduces gas flow from regions below the central ringed portion 163 to regions above the central ringed portion 163 and in the opposite direction as well. In some embodiments, the central ring portion 163 is positioned from about 0.1 mm to about 2.0 mm, such as from about 0.4 mm to about 1.0 mm from the preheat ring 135 to reduce the gas flow between the different regions.

The support ring 160 is located at a further horizontal distance from the central vertical axis C than the plurality of inner supports 155 are located relative to central vertical axis C. The substrate support assembly 150 further includes an upper plate 168 positioned on the top of the support ring 160. The upper plate 168 and the lower plate 153 each have a larger cross-sectional area in a horizontal plane than a cross-sectional area of the susceptor 156 in a horizontal plane. In some embodiments, the inner supports 155, the support ring 160, the lower plate 153, and the upper plate 168 can be formed of quartz. In some of these embodiments, these components can be formed of a low-OH quartz material having an OH content of less than about 30 parts per million (ppm), such as less than about 15 ppm, such as about 5 ppm or less. The low-OH content of the quartz can reduce the amount of radiation that is absorbed by these components.

The process chamber 101 further includes an upper liner assembly 130 positioned around an outer portion of the interior volume 115. In some embodiments, the upper liner assembly 130 can be attached to different portions of the chamber body 102 as well as to the upper chamber 111. In some embodiments, the upper liner assembly 130 can extend 360 degrees around the interior volume 115 with the same shape or substantially the same shape for the entire 360 degrees. Additional details on the upper liner assembly 130 is provided in reference FIG. 1B described below. In some embodiments, the upper liner assembly 130 (also referred to as the hot-cavity liner) can be formed of quartz, such as silicon-impregnated quartz. The upper liner assembly 130 can be configured to have low thermal conductivity. For example, an upper liner assembly 130 formed of quartz can have a thermal conductivity of 1.38 W/m·K at 20° C.

The upper liner assembly 130 can be positioned around the substrate support assembly 150, for example when the substrate support assembly 150 is in the raised processing position $150_1$ shown in FIG. 1A. The process chamber 101 can further include a preheat ring 135 positioned on an inner ledge 134 of the upper liner assembly 130.

The substrate support assembly 150 and the upper liner assembly 130 can substantially seal a processing region 151 from a remainder of the interior volume 115 when the substrate support assembly 150 is in the processing position $150_1$. The processing region 151 is bounded (1) on the upper side by the upper plate 168, (2) on the lower side by the lower plate 153, and (3) on the sides by the upper liner assembly 130. The upper plate 168 can be positioned from about 0.1 mm to about 2.0 mm, such as from about 0.4 mm to about 1.0 mm from the upper liner assembly 130, which can substantially seal the portion of the interior volume 115 above the upper plate 168 from the processing region 151, which can reduce unintended depositions in this portion of the interior volume 115. The lower plate 153 can be positioned from about 0.1 mm to about 2.0 mm, such as from about 0.4 mm to about 1.0 mm from a lower portion 132 of the upper liner assembly 130, which can substantially seal the processing region 151 from portions of the interior volume 115 below the lower plate 153.

The process chamber 101 further includes a lower liner assembly 140 (also referred to as the cold-cavity liner) positioned below the upper liner assembly 130. The lower liner assembly 140 can assist in cooling the temperature of the substrate 50 when the substrate 50 is separated from a cleaning environment as shown in FIG. 1C described below. In some embodiments, the lower liner assembly 140 can be formed of a material having a higher thermal conductivity than the upper liner assembly 130, such as silicon carbide or graphite coated with silicon carbide. A lower liner assembly 140 formed of silicon carbide can have a thermal conductivity of 200 W/m·K at 20° C. A lower liner assembly 140 formed of graphite can have a thermal conductivity of 107 W/m·K at 20° C. In some embodiments, the thermal conductivity of the lower liner assembly 140 is at least 50% greater, such as at least 100% greater, such as at least five times greater, such as at least ten times greater, such as at least 50 times greater or 100 times greater than the thermal conductivity of the upper liner assembly 130.

The gas inlet module 107 includes a gas inlet line 123. The gas inlet line 123 can extend through the body of the gas inlet module 107 and through a portion of the upper liner assembly 130 above the preheat ring 135 to enter the processing region 151. Process gases from the process gas source 121 can be provided to the gas inlet 123. Once entering the processing region 151, the process gases can flow around the one more of the upper portions 162 of the support ring 160, so that the gas can flow over the substrate 50 positioned on the susceptor 156. The process gases provided over the substrate 50 can then react and form a deposition layer on the substrate 50. Unreacted process gases and any byproducts can then be exhausted from the processing region 151 by the exhaust pump 129. Cleaning gases can be provided to the interior volume 115 through the gas inlet 123 when the substrate support assembly 150 is in a cleaning position $150_2$ as described below in reference to FIG. 1C.

The gas outlet module 108 includes a gas outlet line 128. The gas outlet line 128 can include an upper portion 128U extending through the body of the gas outlet module 108 and through a portion of the upper liner assembly 130 above the preheat ring 135, so that gases can be exhausted from the processing region 151. The gas outlet line 128 can further include a lower portion 128L extending through the body of the gas outlet module 108 and through a portion of the lower liner assembly 140, so that purge gases or other gases (e.g., chilled gases) can be exhausted from the interior volume 115. Use of the lower portion 128L located below the processing region 151 reduces the amount of purge gas that reaches processing region 151, which can prevent the process gases above the substrate 50 from becoming diluted.

The gas inlet module 107 can further include a purge gas inlet line 125. The purge gas inlet line 125 can extend through the body of the gas inlet module 107 and through a portion of the lower liner assembly 140 to enter the interior volume 115 below the substrate support assembly 150 when the substrate support assembly 150 is in the processing position $150_1$ shown in FIG. 1A. The purge gas can prevent process gases from entering the portions of the interior volume 115 below the substrate support assembly 150 when the substrate support assembly 150 is in the processing position $150_1$. Some of the purge gases can flow up around the lower plate 153 and between small gaps between the lower plate 153 and the bottom of the upper liner assembly 130. The purge gas can be exhausted by the exhaust pump 129 from the interior volume 115 in a similar manner as described above for the process gases. Also, most of the purge gas can be exhausted through the lower portion 128L of the outlet line 128 to reduce the amount of purge gas that enters the processing region 151.

The process chamber 101 can further include a chilled gas line 127 extending from the chilled gas source 126, through the actuator 147, the shaft 146, and to a gas inlet 154 included in the lower plate 153, so that the chilled gas from the chilled gas source 126 can enter the interior volume 115 of the process chamber 101. The chilled gas can be used to cool the substrate 50 when the substrate support assembly 150 is in the cooling position $150_2$ as shown in FIG. 1C after a process is performed on the substrate 50. In some embodiments, the chilled gases can be the same as the purge gases. For example, in some embodiments, the purge gas and the chilled gas can include one or more of nitrogen, argon, and helium.

The processing system 100 also includes the controller 175 for controlling processes performed by the processing system 100. The controller 175 can be any type of controller used in an industrial setting, such as a programmable logic controller (PLC). The controller 175 includes a processor 177, a memory 176, and input/output (I/O) circuits 178. The controller 175 can further include one or more of the following components (not shown), such as one or more power supplies, clocks, communication components (e.g., network interface card), and user interfaces typically found in controllers for semiconductor equipment.

The memory 176 can include non-transitory memory. The non-transitory memory can be used to store the programs and settings described below. The memory 176 can include one or more readily available types of memory, such as read only memory (ROM) (e.g., electrically erasable programmable read-only memory (EEPROM), flash memory, floppy disk, hard disk, or random access memory (RAM) (e.g., non-volatile random access memory (NVRAM)).

The processor 177 is configured to execute various programs stored in the memory 176, such as epitaxial deposition processes, cleaning processes and sequences for moving the substrate support assembly 150 and exchanging substrates as described in further detail below. During execution of these programs, the controller 175 can communicate to I/O devices through the I/O circuits 178. For example, during execution of these programs and communication through the I/O circuits 178, the controller 175 can move the substrate support assembly 150 to the processing position in FIG. 1A or to the cleaning position shown in FIG. 1C. The memory 176 can further include various operational settings used to control the processes performed in the process chamber 101, such as the temperature, pressure, and gas flow rates during a deposition, cleaning, or cooling procedure.

Figure 1B:
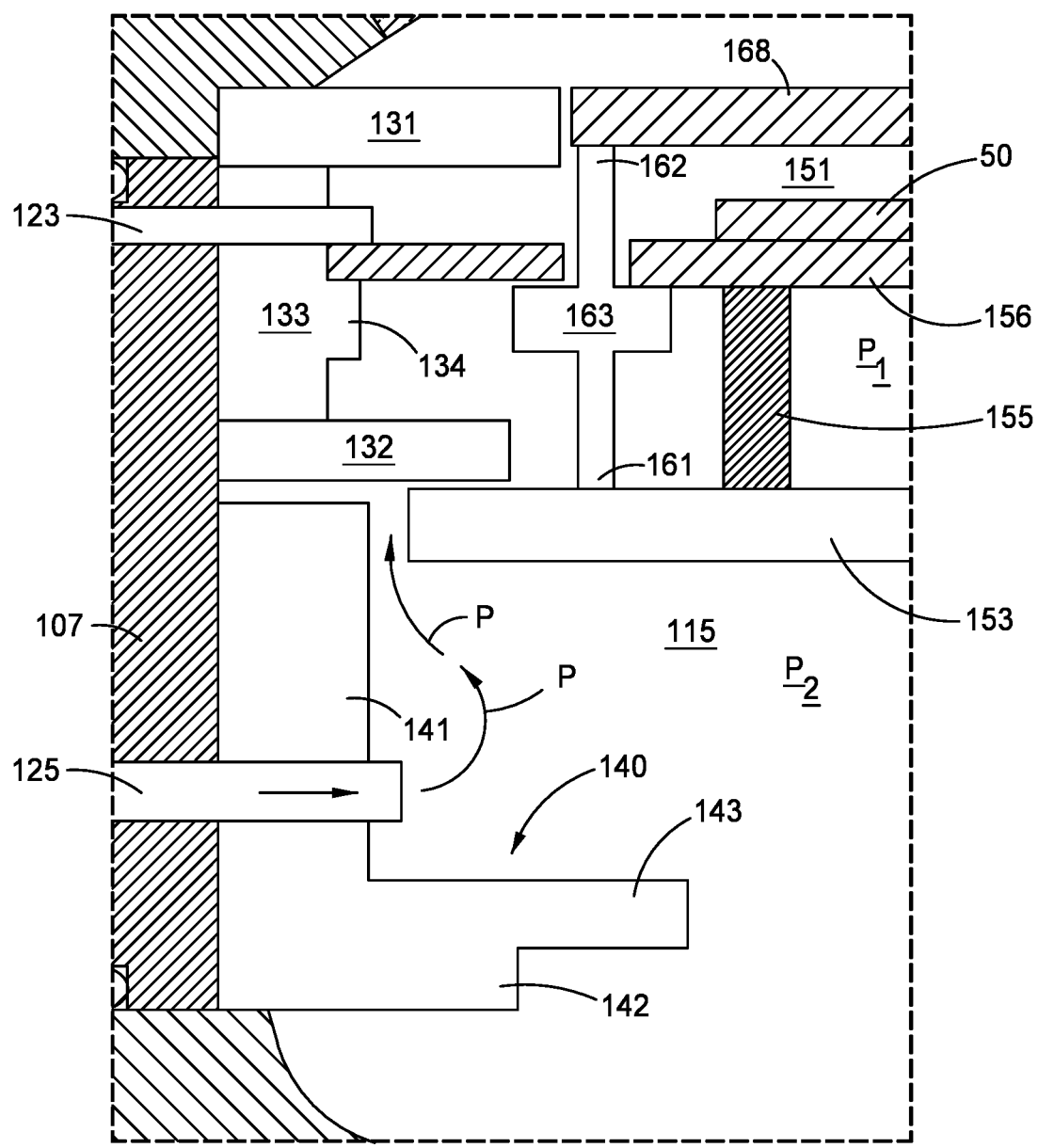
FIG. 1B is a close-up cross-sectional view of section 1B of FIG. 1A showing additional detail of the substrate support assembly and liner assemblies, according to one embodiment.
Figure 1C:
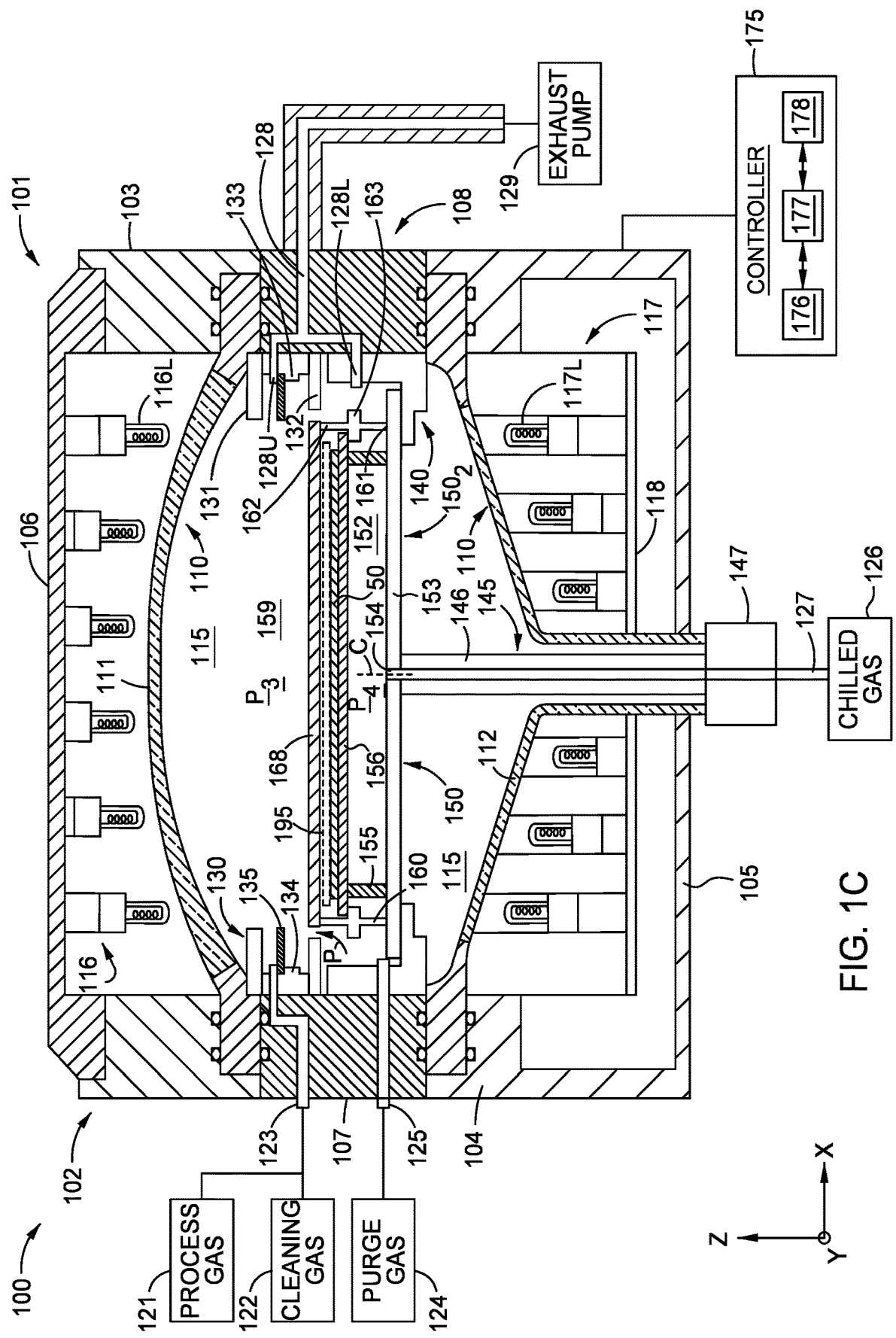
FIG. 1C is a cross-sectional view of the processing system of FIG. 1A with the substrate support assembly in a cleaning position, according to one embodiment.

FIG. 1B is a close-up cross-sectional view of section 1B of FIG. 1A showing additional detail of the substrate support assembly 150 and liner assemblies 130, 140, according to one embodiment.

The upper liner assembly 130 includes an upper portion 131, a lower portion 132, and a middle portion 133. The middle portion 133 includes the ledge 134 that extends inwardly and supports the preheat ring 135. Although the portions 131-133 are shown as separate components in some embodiments, the portions 131-133 can be formed of one integral body. In some embodiments, the portions 131-133 of the upper liner assembly 130 can be formed of a thermally insulating material (i.e., material having low thermal conductivity), such as quartz or silicon-impregnated quartz. The thermal insulation properties of the portions 131-133 can help the upper portion of the process chamber 101 retain heat, so that heating the upper portion of the interior volume 115 during processes (e.g., depositions) and cleaning procedures is accomplished more quickly and with less energy.

The lower liner assembly 140 can include an upper portion 141 and a lower portion 142. The lower portion 142 can include a ledge 143 that is configured to support the lower plate 153 of the substrate support assembly 150 when the substrate support assembly 150 is in the cleaning position as shown in FIG. 1C. In some embodiments, the lower liner assembly 140 can be formed of a thermally conductive material, such as graphite coated with silicon carbide.

During operation, the purge gas P can enter the interior volume 115 through the gas inlet 125. Although most of purge gas P can be exhausted through the lower portion 128L of the gas outlet line 128 (see FIG. 1A), some of the purge gas P can flow up into the processing volume 151. A pressure $P_1$ in the processing volume 151 can be configured to be lower than a pressure $P_2$ in the portion of the interior volume 115 below the processing volume 151. Due to this pressure differential, some of the purge gas P flows up into the processing volume 151 through a small gap between the top of the lower plate 153 and the bottom of the lower portion 132 of the upper liner assembly 130 as well through a small gap between the top of the central ringed portion 163 and the bottom of the preheat ring 135. These small gaps can be from about 0.1 mm to about 2.0 mm, such as from about 0.4 mm to about 1.0 mm. The higher pressure $P_2$ in the interior volume 115 below the lower plate 153 compared to the pressure $P_1$ in the processing volume 151 prevents process gases from entering the portion of processing volume 115 below the lower plate 153, which prevents unintended depositions on components below the lower plate 153.

In some embodiments (not shown), the central ringed portion 163 only extends inwardly relative to the lower portion 161 and the upper portion 162. This can allow the upper plate 168 to have a same gap (e.g., a few mm) between the upper portion 131 of the upper liner assembly 130 when the substrate support assembly 150 is in the processing position $150_1$ shown in FIGS. 1A and 1B (see FIGS. 1A and 1B) as the gap between the upper plate 168 and the lower portion 132 of the upper liner assembly 130 when the substrate support assembly 150 is in the cleaning position $150_2$ as shown in FIG. 1C.

FIG. 1C is a cross-sectional view of the processing system 100 with the substrate support assembly 150 in a cleaning position $150_2$, according to one embodiment. In FIG. 1C, the substrate support assembly 150 has been lowered relative to the processing position $150_1$ shown in FIG. 1A. With the substrate support assembly 150 in the cleaning position $150_2$, components in a cleaning region 159 of the interior volume 115 above the upper plate 168 can be cleaned by cleaning gases supplied by the cleaning gas source 122. The cleaning region 159 can be substantially bounded by the upper plate 168 and the lower portion 132 of the upper liner assembly 130 on the bottom, the upper chamber 111 on the top, and the upper liner assembly 130 around the sides. In FIG. 1C, the substrate 50 is located in a cooling region 152 below the upper plate 168. The cooling region 152 is substantially bounded by the upper plate 168 on the top, the lower plate 153 on the bottom, and the lower liner assembly 140 around the sides.

In some embodiments, the lower plate 153 can be positioned on a top of the ledge 143 of the lower liner assembly 140. In other embodiments, the lower plate 153 can be positioned slightly above the ledge 143, so that the substrate support assembly 150 can be rotated during the cleaning procedure and cooling process to increase the cooling rate and/or uniformity of cooling for the substrate 50.

When the substrate support assembly 150 is in the cleaning position $150_2$, cleaning gases from the cleaning gas source 122 can be provided to the cleaning region 159 while purge gases from the purge gas source 124 and/or chilled gases from the chilled gas source 126 can be provided to the cooling region 152. In some embodiments, cleaning gases, such as hydrogen chloride, can be provided to the cleaning region 159 to clean the components in the cleaning region 159, such as the upper liner assembly 130, the preheat ring 135, and the upper chamber 111. In some embodiments, the cleaning procedure can be performed to operate the cleaning region 159 (1) at a temperature from about 400° C. to about 1200° C., such as from about 700° C. to about 1000° C. and (2) at a pressure from about 5 Torr to about 760 Torr, such as about 30 Torr. The process performed on the substrate 50 when the substrate support assembly 150 is in the processing position $150_1$ (see FIG. 1A), can be performed within the same ranges of temperature and pressure described above for the cleaning procedure.

Conversely, the purge gas from the purge gas source 124 and/or the chilled gas from the chilled gas source 126 can be used to operate the cooling region 152 when the substrate support assembly 150 is in the cleaning position $150_2$ at a lower temperature and a higher pressure. For example, in some embodiments, the cooling region 152 is cooled to a temperature from about 300° C. to about 800° C., such as a temperature from about 500° C. to about 700° C. In some embodiments, the chilled gas can be provided to the cooling region 152 through the gas inlet 154 at a temperature below room temperature (e.g., <20° C.) or a temperature below 0° C. The cooling region 152 can be operated at a pressure $P_4$ that is higher (e.g., by a few Torr) than a pressure $P_3$ of the cleaning region 159 to ensure that cleaning gases (e.g., HCl gas) do not enter the cooling region 159 and interact with the substrate 50. Due to this pressure differential, some purge gas P and/or chilled gas can enter the cleaning region 159 though the gap between the upper plate 168 and the lower portion 132 of the upper liner assembly 130. The lower portion 128L of the gas outlet line 128 can be used to limit the amount of purge gas and/or chilled gas that enters the cleaning region 159 by exhausting the purge gas and/or chilled gas directly from the cooling region 152.

The process chamber 101 can further include a slit valve 195 or other device configured to make an opening to transfer substrates 50 into and out of the interior volume 115. The slit valve 195 can be opened to allow access to the cooling region 152 by a transfer robot (not shown) to remove the substrate 50 in the cooling region 152 of the process chamber 101 and then add a new substrate 50 to the cooling region 152 of the process chamber 101. In some embodiments, this exchange of replacing the substrate 50 in the cooling region 152 with a new substrate 50 can happen while the cleaning region 159 is being cleaned by the cleaning gases. Enabling an exchange of substrates 50 while a portion of the process chamber is being cleaned can significantly increase throughput. Conventional processing systems have required removal of substrates during cleaning procedures, which increases the average amount of time to perform a given process on a substrate in the process chamber that can only be cleaned when there are no substrates in the process chamber. Furthermore, for many high-temperature processes, the substrate is cooled before the substrate is removed. Thus, for many conventional processes, such as an epitaxial deposition, (1) the process is performed, then (2) the substrate is cooled, then (3) the substrate is removed, then (4) the cleaning procedure is performed with no substrate in the process chamber, and then (5) the new substrate is positioned in the process chamber after the cleaning procedure is completed. The improvements offered by this disclosure allow operations (2), (3), and (5) all to be performed while the cleaning procedure (i.e., operation (4)) is being performed.

Furthermore, because the cleaning region 159 is substantially isolated from the cooling region 152, these regions can be configured to be simultaneously operated at significantly different temperatures, such as temperatures that differ by at least 50° C., such as by at least 100° C., such as by at least 300° C. or more. This can allow the temperature of components in the cleaning region 159 to remain closer to temperatures used during the process (e.g., epitaxial deposition), which can allow target process temperatures to be reached more quickly and with less energy when the new substrate 50 is positioned in the processing position $150_1$ as shown in FIG. 1A, which can also increase throughput for the process chamber 101 and decrease costs. Additionally, forming the upper liner assembly 130 of a material having low thermal conductivity enables the upper liner assembly to retain heat while forming the lower liner assembly 140 of a material having high thermal conductivity enables the temperature of the cooling region 152 to rapidly cool, so that the substrate 50 can be cooled and removed from the process chamber 101 more quickly.

Figure 2A:
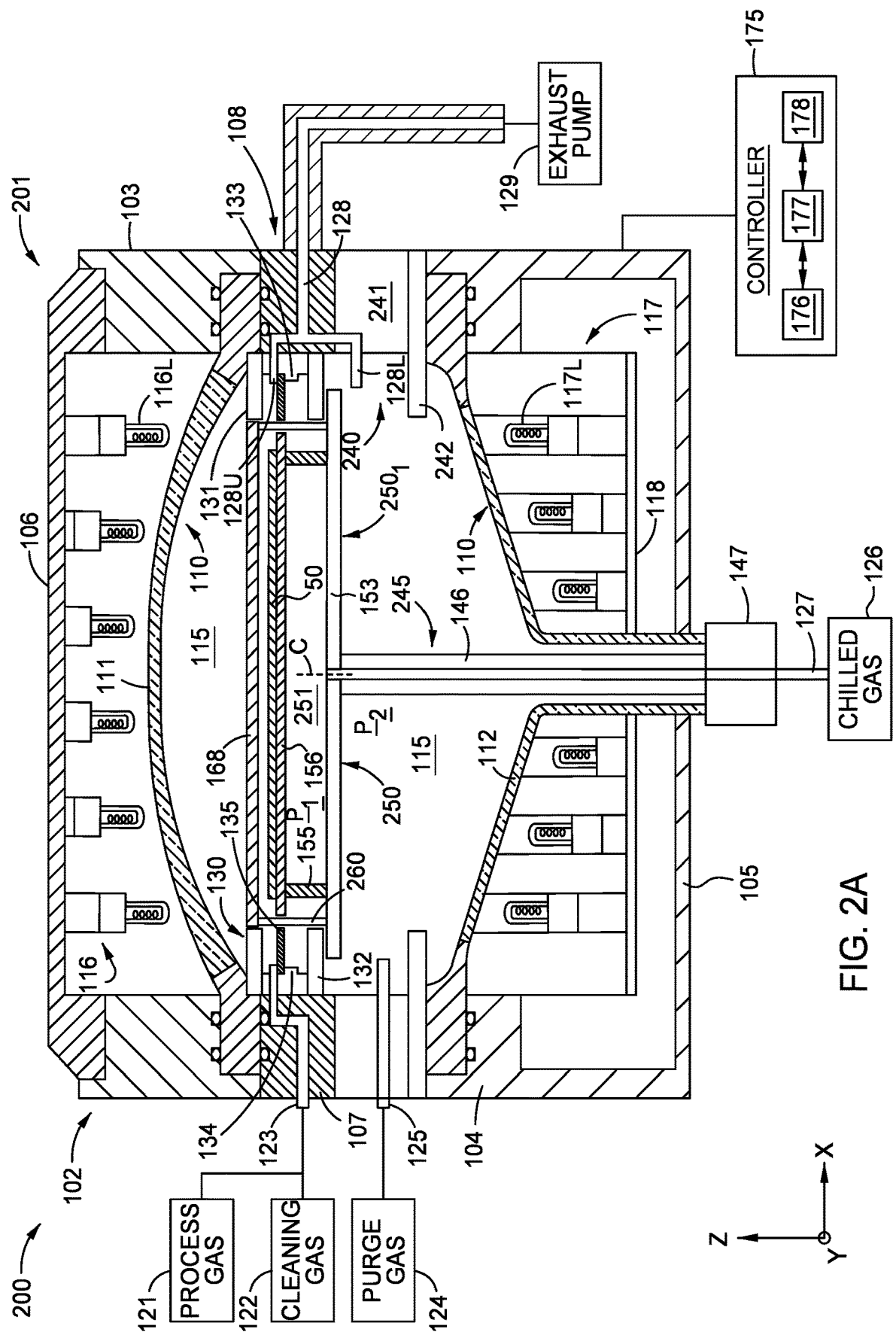
FIG. 2A is a cross-sectional view of another processing system with a substrate support assembly in a process position, according to one embodiment.
Figure 2B:
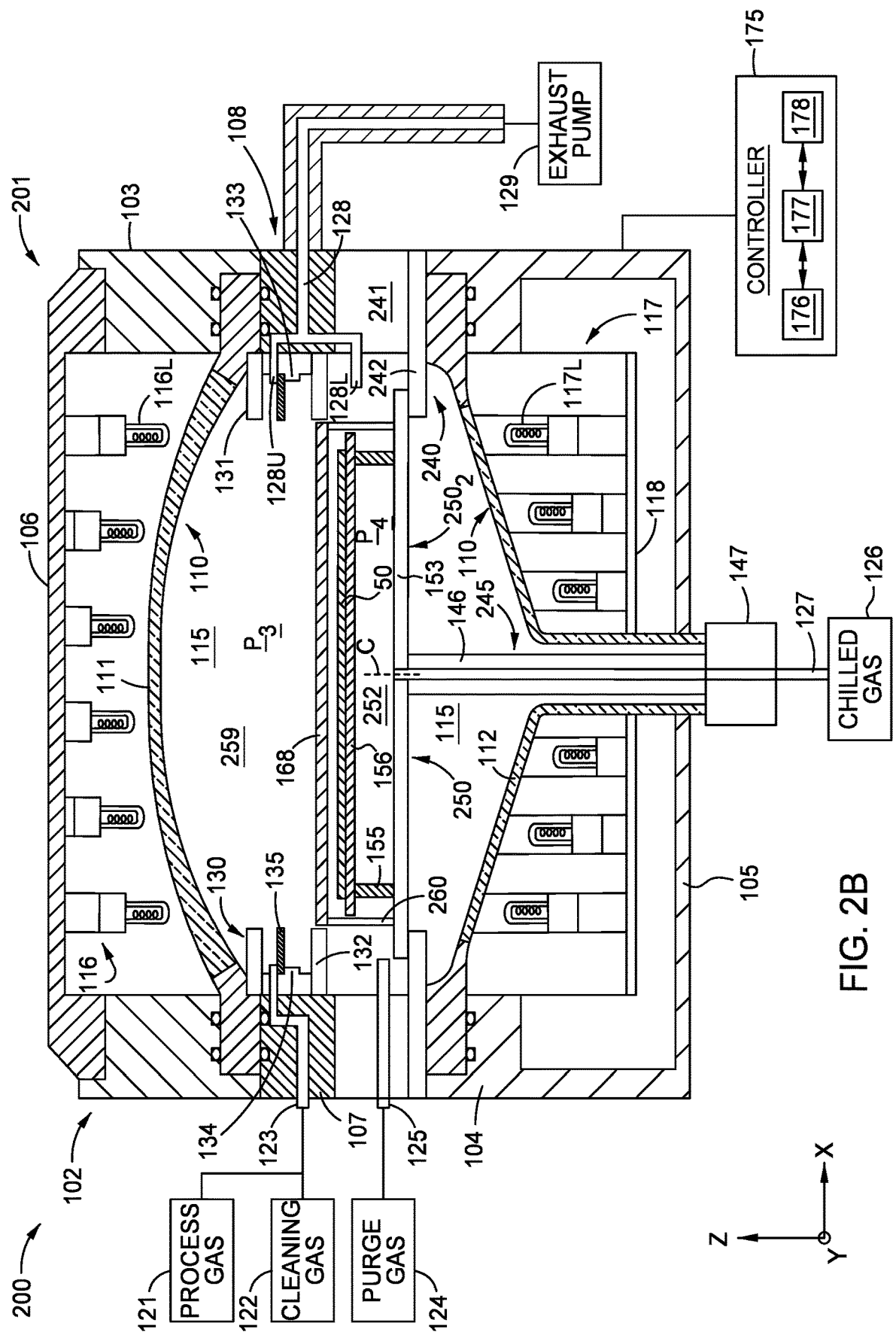
FIG. 2B is a cross-sectional view of the processing system of FIG. 2A with the substrate support assembly in a cleaning position, according to one embodiment.

FIG. 2A is a cross-sectional view of a processing system 200 with a substrate support assembly 250 in a process position $250_1$, according to one embodiment. FIG. 2B is a cross-sectional view of the processing system 200 with the substrate support assembly 250 in a cleaning position $250_2$, according to one embodiment.

In FIG. 2A, the substrate 50 is positioned in a processing region 251, which is generally similar to the processing region 151 described above. The temperature and pressure in the processing region 251 and other regions of the interior volume 115 can be operated within the same ranges described above for the process chamber 101 when the substrate support assembly is in the processing position $250_1$. For example, FIG. 2A shows the same pressures as shown in FIG. 1B with the pressure $P_1$ in the processing region 251 being less than the pressure $P_2$ below the lower plate 153 of the substrate support assembly 250.

In FIG. 2B, the substrate 50 is positioned in a cooling region 252, which is generally similar to the cooling region 152 described above. The region above the upper plate 168 in FIG. 2B is referred to as the cleaning region 259, which is generally similar to the cleaning region 159 described above. When the substrate support assembly 250 is in the cleaning position $250_2$, the temperature and pressure of the cooling region 252 and the cleaning region 259 can be operated within the same ranges as those ranges described above for the cooling region 152 and the cleaning region 159 in reference to FIG. 1C. For example, FIG. 2B shows the same pressures as shown in FIG. 1C with the pressure $P_3$ in the cleaning region 259 being less than the pressure $P_4$ in the cooling region 252.

The processing system 200 is the same as the processing system 100 described above except that the processing system 200 includes a process chamber 201 instead of the process chamber 101 described above. The process chamber 201 is the same as the process chamber 101 described above except for the following differences. The process chamber 201 includes a lower liner assembly 240 instead of the lower liner assembly 140 described above. Furthermore, the process chamber 201 includes a substrate support apparatus 245 instead of the substrate support apparatus 145 described above. Some dimensions of the upper liner assembly 130 are also adjusted but the overall design is the same, so the same reference numerals are used to describe the upper liner assembly 130 in reference to FIGS. 2A and 2B.

In the process chamber 201, the lower liner assembly 240 extends closer to the exterior of the process chamber than the lower liner assembly 140 described above. In some embodiments, the lower liner assembly 240 can extend to the exterior of the process chamber 201. The lower liner assembly 240 can be formed of a material having high thermal conductivity, such as the materials described above for forming the lower liner assembly 140. Having the lower liner assembly 240 extend closer to the exterior of the process chamber 201 compared to the liner assembly 140 (see FIG. 1A) or to the exterior of the process chamber 201 can allow the lower liner assembly 240 to lose heat at a more rapid rate when the substrate 50 is being cooled. This increased rate of cooling can allow the substrate 50 to cool more rapidly and can allow a cooled substrate 50 to be removed from the process chamber 201 after a shorter time period compared to longer cooling processes, which can increase throughput of the process chamber in some embodiments.

The substrate support apparatus 245 is the same as the substrate support apparatus 145 described above except that the substrate support apparatus 245 includes a substrate support assembly 250 instead of the substrate support assembly 150 included in the substrate support apparatus 145. The substrate support assembly 250 is the same as the substrate support assembly 150 except that the substrate support assembly 250 includes a plurality of supports 260 (e.g., three supports) that support the upper plate 168 instead of the support ring 160 describe above.

Although the supports 260 lack the central ringed portion 163 included in the support ring 160 (FIG. 1A), the supports 260 allow the upper plate 168 to be positioned at a same or highly similar small gap (1) from the upper portion 131 of the liner assembly 130 when the substrate support assembly 250 is in the processing position $250_1$ (FIG. 2A) and (2) from the lower portion 132 of the upper liner assembly 130 when the substrate support assembly 250 is in the cleaning position $250_2$ (FIG. 2B). This same of highly similar small gap can be from about 0.1 mm to about 2.0 mm, such as from about 0.4 mm to about 1.0 mm. This small gap in both positions $250_1$, $250_2$ can (1) reduce the amount of process gas that goes above the upper plate 168 when the substrate support assembly 250 is in the processing position $250_1$ (FIG. 2A), which can reduce cleaning, and (2) reduce the amount of purge gas and/or chilled gas that goes above the upper plate 168 when the substrate support assembly 250 is in the cleaning position $250_2$ (FIG. 2B), which can prevent these gases from cooling the cleaning region 259 and from diluting the cleaning gases in the cleaning region 259.

Figure 3A:
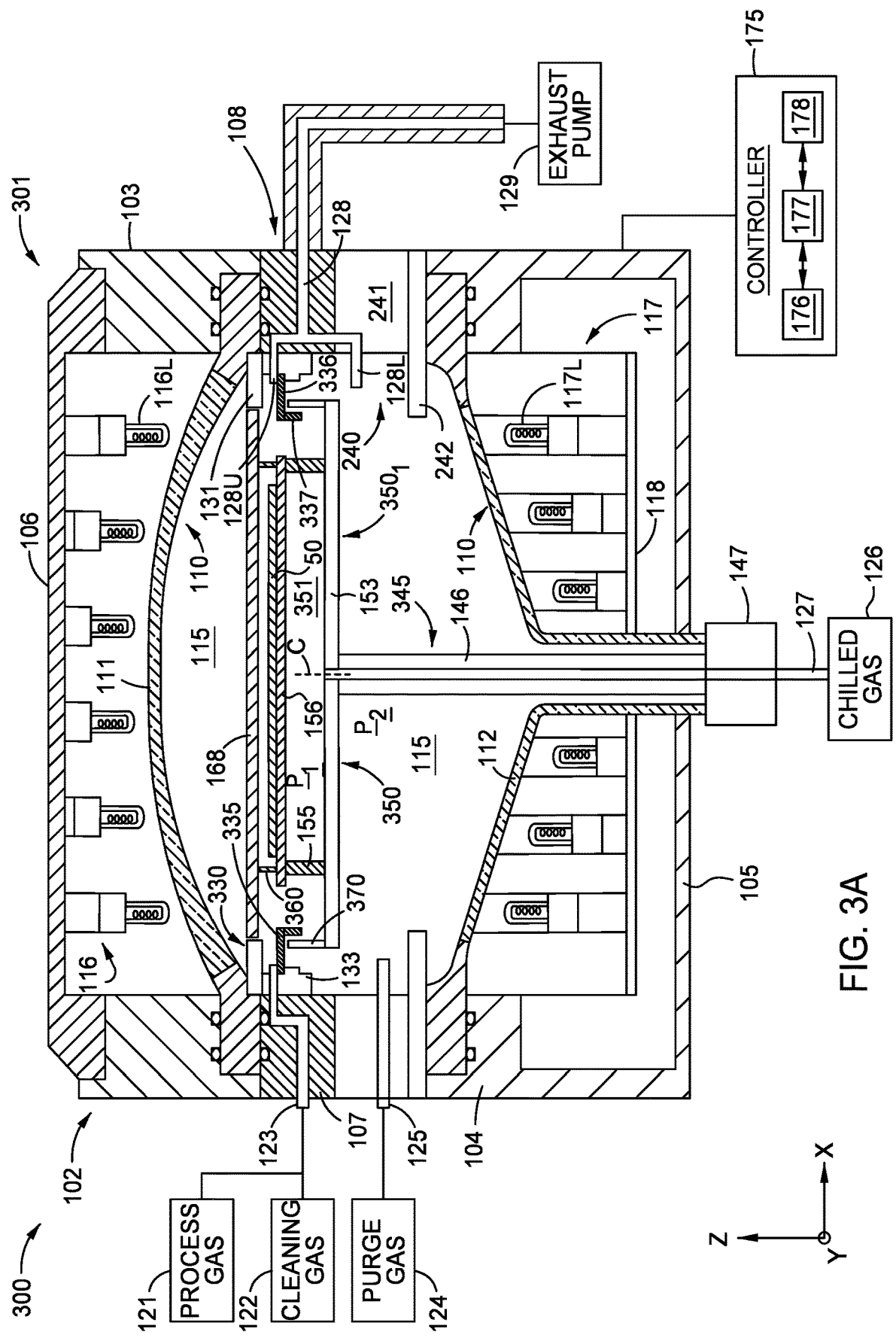
FIG. 3A is a cross-sectional view of another processing system with a substrate support assembly in a process position, according to one embodiment.
Figure 3B:
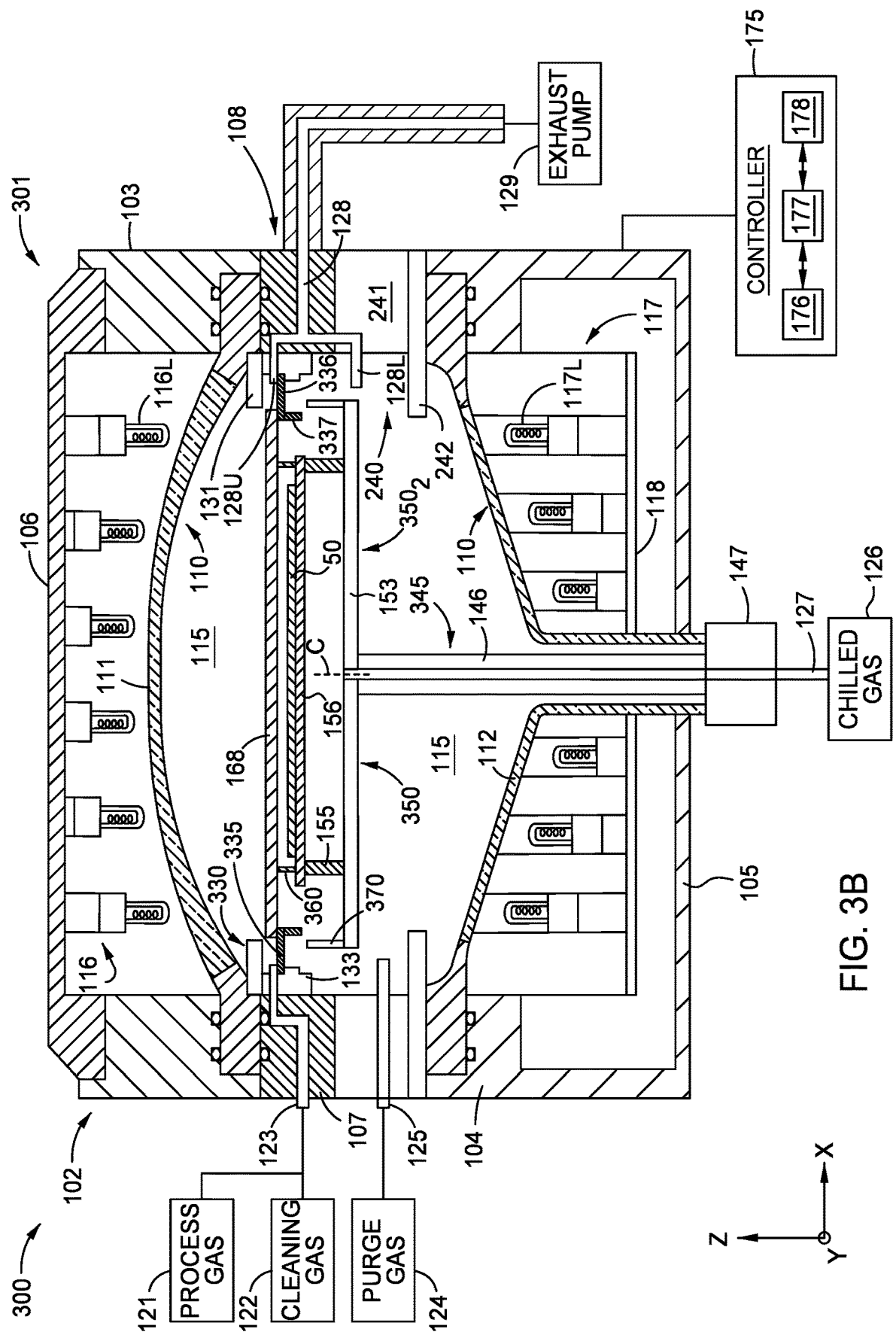
FIG. 3B is a cross-sectional view of the processing system of FIG. 3A with the substrate support assembly in an intermediate position, according to one embodiment.
Figure 3C:
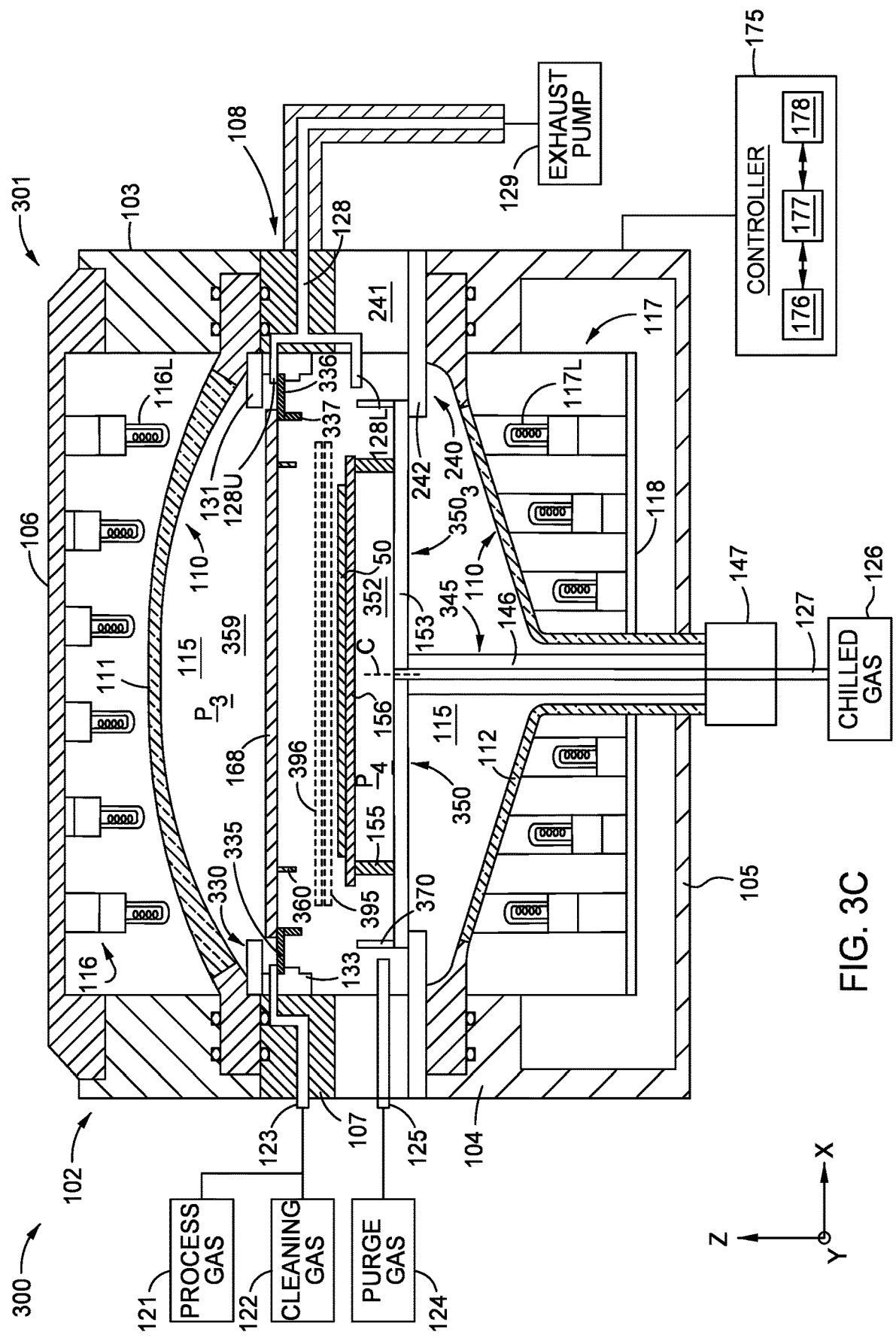
FIG. 3C is a cross-sectional view of the processing system of FIG. 3A with the substrate support assembly in a cleaning position, according to one embodiment.

FIG. 3A is a cross-sectional view of a processing system 300 with a substrate support assembly 350 in a process position $350_1$, according to one embodiment. FIG. 3B is a cross-sectional view of the processing system 300 with the substrate support assembly 350 in an intermediate position 350₂, according to one embodiment. FIG. 3C is a cross-sectional view of the processing system 300 with the substrate support assembly 350 in a cleaning position 350₃, according to one embodiment.

In FIG. 3A, the substrate 50 is positioned in a processing region 351, which is generally similar to the processing region 151 described above. The temperature and pressure in the processing region 351 and other regions of the interior volume 115 can be operated within the same ranges described above for the process chamber 101 when the substrate support assembly is in the processing position 350₁. For example, FIG. 3A shows the same pressures as shown in FIG. 1B with the pressure $P_1$ in the processing region 351 being less than the pressure $P_2$ below the lower plate 153 of the substrate support assembly 350.

In FIG. 3C, the substrate 50 is positioned in a cooling region 352, which is generally similar to the cooling region 152 described above. The region above the upper plate 168 in FIG. 3B is referred to as the cleaning region 359, which is generally similar to the cleaning region 159 described above. When the substrate support assembly 350 is in the cleaning position 350₃, the temperature and pressure of the cooling region 352 and the cleaning region 359 can be operated within the same ranges as those ranges described above for the cooling region 152 and the cleaning region 159 in reference to FIG. 1C. For example, FIG. 3C shows the same pressures as shown in FIG. 1C with the pressure $P_3$ in the cleaning region 359 being less than the pressure $P_4$ in the cooling region 352.

The processing system 300 is the same as the processing system 200 (see FIG. 2A) described above except that the processing system 300 includes a process chamber 301 instead of the process chamber 201 described above. The process chamber 301 is the same as the process chamber 201 described above except for the following differences. The process chamber 301 includes a preheat ring 335 instead of the preheat ring 135 described above. The process chamber 301 includes an upper liner assembly 330 instead of the upper liner assembly 130 described above. Furthermore, the process chamber 301 includes a substrate support apparatus 345 instead of the substrate support apparatus 245 described above.

The preheat ring 335 is the same as the preheat ring 135 described above except that preheat ring 335 includes a body 336 and an inner extension 337. The body 336 can be substantially the same (e.g., same or similar material and dimensions) as the preheat ring 135 described above. The inner extension 337 can be formed of the same material as the preheat ring 135 described above. The inner extension 337 can extend downwardly from the inner edge of the body 336.

The upper liner assembly 330 is the same as the upper liner assembly 130 described above except that the upper liner assembly 330 does not include the lower portion 132 described above and the dimensions of the other portions (e.g., portions 131, 133) may be different.

The substrate support apparatus 345 is the same as the substrate support apparatus 245 except that the substrate support apparatus 345 includes a substrate support assembly 350 instead of the substrate support assembly 250 described above. The substrate support assembly 350 is the same as the substrate support assembly 250 described above except that the substrate support assembly 350 includes a plurality of supports 360 (e.g., three supports 360) to support the upper plate 168 over the susceptor 156 instead of the supports 260, and the substrate support assembly 350 further includes an outer ring 370 extending upwardly from the lower plate 153. The supports 360 can be suspended from the bottom of the upper plate 168 as more clearly shown in FIGS. 3B and 3C. In some embodiments, the supports 360 can have a pin shape. The supports 360 can be positioned to contact the susceptor 156 as the susceptor 156 is raised to the processing position 350₁ shown in FIG. 3A.

The inner extension 337 of the preheat ring 335 and the outer ring 370 of the substrate support assembly 350 are positioned to form a tortuous path for gas (e.g., purge gas) to flow from below the lower plate 153 to a location above the lower plate 153 and directly above or below the susceptor 156 in the processing region 351 when the substrate support assembly 350 is in the processing position 350₁. This tortuous path with no direct line of sight from below the lower plate 153 to a portion of the processing region 351 directly underlying or overlying the susceptor 156 can help reduce the amount of purge gas that enters the processing region 351 and can reduce the likelihood or degree that the purge gas may dilute the process gas that interacts with the substrate 50.

In FIG. 3B, as the substrate support assembly 350 is lowered by the actuator 147 to the intermediate position 350₂, the lower surface of the upper plate 168 contacts the upper surface of the body 336 of the preheat ring 335. In FIG. 3C, the substrate support assembly 350 is lowered by the actuator 147 to the cleaning position 350₃. In the cleaning position 350₃, the upper plate 168 is resting on the preheat ring 335, which can create a seal between the cleaning region 359 and the cooling region 352 below the upper plate 168.

With reference to FIG. 3C, the process chamber 301 can further include a slit valve 395 or other device configured to make an opening to transfer substrates 50 into and out of the cooling region 352 of the process chamber 301. The slit valve 395 can be opened to allow access to the cooling region 352 by a transfer robot (not shown) to remove the substrate 50 in the cooling region 352 of the process chamber 301, and then add a new substrate 50 to the cooling region 352 of the process chamber 301. The process chamber 301 can further include a gas inlet 396 positioned adjacent to the slit valve 395. For example, the slit valve 395 and the gas inlet 396 can be positioned at a same angular location relative to the central axis C. The gas inlet 396 can be connected to the purge gas source 124 and/or the chilled gas source 126. The gas inlet 396 is positioned to direct gas at the substrate 50 when the substrate support assembly 350 is in the cleaning position 350₃ shown in FIG. 3C. Furthermore, the gas flow from the gas inlet 396 can assist in preventing gas from inside the process chamber 301 flowing out through the opening of the slit valve 395 when substrates are exchanged through the opening of the slit valve 395. In some embodiments, the pressure of the interior volume 115 of the process chamber 301 can be maintained at a lower pressure than an interior pressure of a transfer chamber (not shown) connected to the slit valve 395 to prevent gas from flowing from the interior of the process chamber 301 to the interior of the transfer chamber. The gas inlet 396 can be included in the other process chambers described in this disclosure as well.

Figure 4:
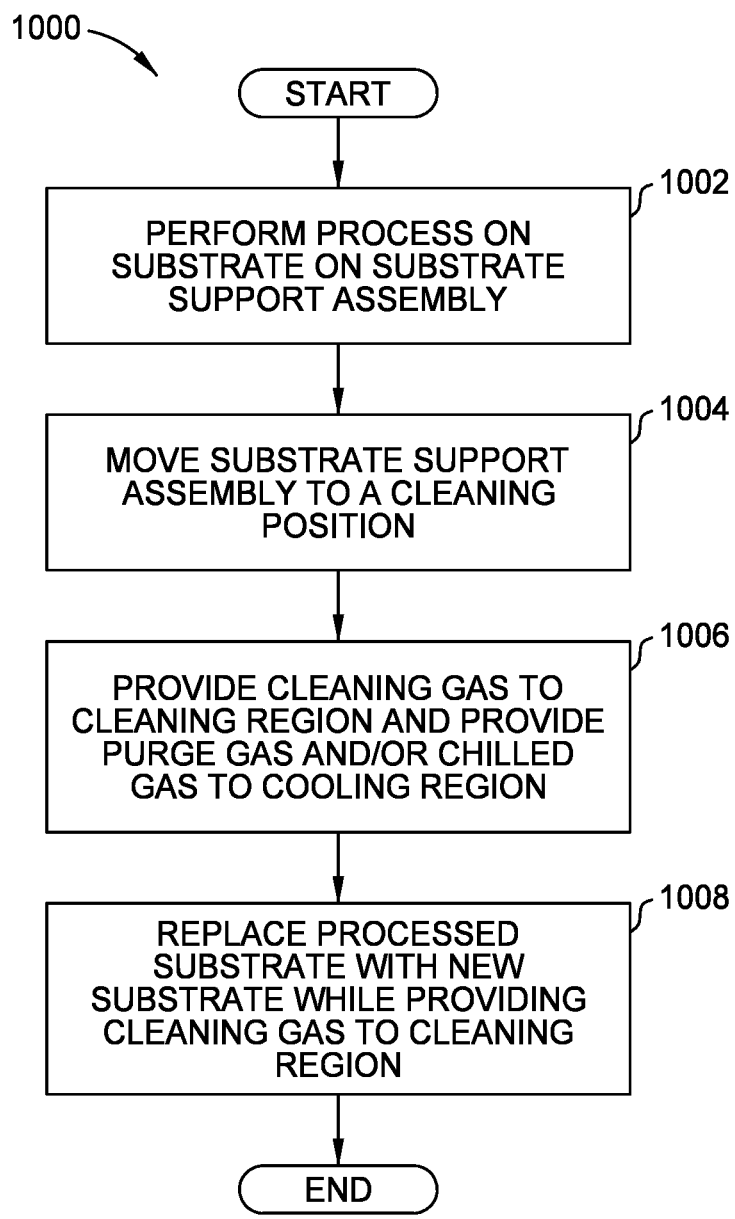
FIG. 4 is a process flow diagram of a method of processing a substrate in a process chamber and cleaning the process chamber, according to one embodiment.

FIG. 4 is a process flow diagram of a method 1000 of processing a substrate in a process chamber and cleaning the process chamber, according to one embodiment. The method 1000 is described in reference to FIGS. 1A-3C. The controller 175 can execute a program stored in memory to perform the method 1000. The method begins at block 1002.

At block 1002 a process (e.g., a deposition) is performed on a substrate 50 that is positioned on one of the substrate support assemblies 150, 250, 350 described above. Process gases can be introduced to the corresponding processing region 151, 251, 351 and purge gases can be introduced below the lower plate 153 of the corresponding substrate support assembly. The lower plate 153 can be positioned in close proximity (e.g., from about 0.4 mm to about 1.0 mm) from one or more other components (e.g., the lower portion 132 of the upper liner assembly 130 or the preheat ring 335) to reduce the amount of purge gas that enters the corresponding processing region during block 1002. The upper plate 168 of the corresponding substrate support assembly can be positioned in close proximity (e.g., from about 0.4 mm to about 1.0 mm) from one or more other components (e.g., the upper portion 131 of the upper liner assembly 130) to reduce the amount of process gases that enter portions of the interior volume 115 above the upper plate 168, which can reduce unintended depositions in these portions of the interior volume 115.

At block 1004, the corresponding substrate support assembly 150, 250, 350 is moved (e.g., lowered) to a cleaning position $150_2, 250_2, 350_3$, so that a cleaning region 159, 259, 359 of the interior volume 115 above the upper plate 168 can be cleaned, and the substrate 50 can be cooled in a cooling region 152, 252, 352 located below the upper plate 168. The upper plate 168 can be positioned in close proximity to one or more other components (e.g., the lower portion 132 of the upper liner assembly 130 as shown in FIGS. 1C and 2B) or on top of a component, such as on top of the preheat ring 335 (see FIG. 3C) to substantially seal the corresponding cleaning region 159, 259, 359 from the corresponding cooling region 152, 252, 352. This seal prevents or reduces the amount of purge gas and/or cooling gas that can enter the corresponding cleaning region and prevents or reduces the amount of cleaning gases that can reach the cooling region.

At block 1006, cleaning gases are introduced to the corresponding cleaning region 159, 259, 359, and purge gas and/or chilled gas are introduced to the corresponding cooling region 152, 252, 352 at the same time. Thus, the components in the corresponding cleaning region are cleaned at the same time the substrate 50 in the cooling region of the same process chamber is cooled. Notably, the substrate 50 is uncovered in the cooling region to allow the purge gas and/or chilled gas to flow over the surfaces of the substrate 50, which enables the substrate 50 to be quickly cooled. In some embodiments, the cleaning gases would damage the substrate 50 if the substrate 50 was exposed to the cleaning gases. The substrate 50 is not exposed to the cleaning gases though because the substrate support assembly is positioned to limit the flow of gas between the cleaning region and the cooling region and because the pressure in the cooling region is slightly higher than the pressure in the cleaning region.

At block 1008, after the existing substrate 50 is cooled to a specified temperature, the processed substrate 50 is replaced with a new substrate 50 while the cleaning gases continue to be provided to the corresponding cleaning region 159, 259, 359.

In some embodiments, the cleaning can be completed before the cooling of the processed substrate 50 is completed. Enabling the cooling of the processed substrate 50 to be performed simultaneously with the cleaning of another portion of the process chamber can substantially increase throughput for a process chamber. In the embodiments described above, the cooling regions are located below the cleaning regions, but in some embodiments, the components in the process chambers can be rearranged, so that the cleaning region is below the cooling region.

While the foregoing is directed to examples of the present disclosure, other and further examples of the disclosure may be devised without departing from the basic scope thereof, and the scope thereof is determined by the claims that follow.

What is claimed is:

1. A process chamber comprising:
    a chamber body enclosing an interior volume;
    a substrate support assembly in the interior volume, the substrate support assembly comprising a substrate receiving surface, an upper plate, and a lower plate, wherein the upper plate is positioned over the substrate receiving surface, and wherein the substrate receiving surface is positioned over and spaced apart from the lower plate;
    a first gas inlet line positioned above the lower plate and below the upper plate when the substrate support assembly is in a first position, the first gas inlet line positioned above the lower plate and above the upper plate when the substrate support is in a second position, wherein the vertical position of the lower plate in a first position is lower than the vertical position of the lower plate in the second position;
    a first gas outlet line positioned above the lower plate and below the upper plate when the substrate support assembly is in the first position, the first gas outlet line positioned above the lower plate and above the upper plate when the substrate is in the second position;
    a second gas inlet line positioned below the lower plate and below the upper plate when the substrate support assembly is in the first position; and
    a second gas outlet line positioned below the lower plate and below the upper plate when the substrate support assembly is in the first position.

2. The process chamber of claim 1, wherein the upper plate and the lower plate each have a larger cross-sectional area in a horizontal plane than a cross-sectional area of the substrate support in a horizontal plane.

3. The process chamber of claim 1, further comprising an upper liner and a lower liner, the upper liner and the lower liner each disposed around an outer portion of the interior volume, wherein the upper liner is formed of a different material than the lower liner.

4. The process chamber of claim 3, wherein the lower liner has a thermal conductivity that is at least 100% greater than the thermal conductivity of the upper liner.

5. The process chamber of claim 4, wherein the lower liner extends to an exterior of the process chamber.

6. The process chamber of claim 3, wherein the substrate support assembly is configured to move from the first position to the second position, wherein the upper plate is positioned from about 0.4 mm to about 1.0 mm from the upper liner in the first position.

7. The process chamber of claim 6, wherein the upper plate is positioned from about 0.4 mm to about 1.0 mm from the lower liner when the substrate support assembly is in the second position.

8. The process chamber of claim 6, wherein the lower plate is positioned from about 0.4 mm to about 1.0 mm from the upper liner when the substrate support assembly is in the first position.

9. The process chamber of claim 6, further comprising a slit valve positioned below the upper plate when the substrate support assembly is in the second position.

10. A process chamber comprising:
a chamber body enclosing an interior volume;
a substrate support assembly in the interior volume, the substrate support assembly comprising a substrate receiving surface, an upper plate, and a lower plate, the upper plate positioned over the substrate receiving surface, wherein the substrate receiving surface is positioned over and spaced apart from the lower plate;
a first ring positioned above the lower plate of the substrate support assembly, wherein a portion of the upper plate of the substrate support assembly extends over the first ring;
a first gas inlet line positioned above the lower plate and below the upper plate when the substrate support assembly is in a first position, wherein the first gas inlet line is positioned above the lower plate and above the upper plate when the substrate support assembly is in a second position; and
a first gas outlet line positioned above the lower plate and below the upper plate when the substrate support assembly is in the first position, wherein the first gas outlet line is positioned above the lower plate and above the upper plate when the substrate support assembly is in the second position.

11. The process chamber of claim 10, further comprising an outer ring extending upward from the lower plate.

12. The process chamber of claim 11, wherein
the first ring includes a body and an inner extension having a ring shape, and
the outer ring underlies a portion of the body of the first ring.

13. The process chamber of claim 12, further comprising an upper liner and a lower liner, the upper liner and the lower liner each disposed around an outer portion of the interior volume, wherein the upper liner is formed of a different material than the lower liner.

14. The process chamber of claim 13, wherein the lower liner has a thermal conductivity that is at least 100% greater than the thermal conductivity of the upper liner.

15. The process chamber of claim 14, wherein the lower liner extends to an exterior of the process chamber.

16. The process chamber of claim 13, wherein the substrate support assembly is configured to move from the first position to the second position, wherein the upper plate is positioned from about 0.4 mm to about 1.0 mm from the upper liner in the first position.

17. The process chamber of claim 16, wherein the upper liner is configured to be supported by the first ring when the substrate support assembly is in the second position.

18. The process chamber of claim 17, wherein the upper plate is spaced apart from the substrate support by a greater distance in the second position than in the first position.

19. The process chamber of claim 10, further comprising:
a second gas inlet line positioned below the lower plate and below the upper plate when the substrate support assembly is in the first position, wherein the second gas inlet line is positioned above the lower plate and below the upper plate when the substrate support assembly is in the second position; and
a second gas outlet line positioned below the lower plate and below the upper plate when the substrate support assembly is in the first position, wherein the second gas outlet line is positioned above the lower plate and below the upper plate when the substrate support assembly is in the second position.

* * * * *